US007615497B2

(12) United States Patent
Bok et al.

(10) Patent No.: US 7,615,497 B2
(45) Date of Patent: Nov. 10, 2009

(54) FORMING FINE PATTERN OF SEMICONDUCTOR DEVICE USING THREE MASK LAYERS AND CMP OF SPIN-ON CARBON LAYER

(75) Inventors: Cheol Kyu Bok, Icheon-si (KR); Keun Do Ban, Yongin-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 132 days.

(21) Appl. No.: 11/964,988

(22) Filed: Dec. 27, 2007

(65) Prior Publication Data
US 2008/0272467 A1 Nov. 6, 2008

(30) Foreign Application Priority Data
May 1, 2007   (KR)   ..................... 10-2007-0042291

(51) Int. Cl.
*H01L 21/306* (2006.01)
*H01L 29/06* (2006.01)
(52) U.S. Cl. .................. 438/736; 438/671; 438/694; 438/737; 438/738; 438/761; 438/952; 438/96; 257/629; 257/E21.215; 257/E29.022
(58) Field of Classification Search .................. 438/76, 438/96, 671, 691, 736–738, 952; 257/629, 257/E21.215, E29.022
See application file for complete search history.

(56) References Cited

U.S. PATENT DOCUMENTS
7,064,078 B2 *  6/2006  Liu et al. ..................... 438/717
7,531,456 B2 *  5/2009  Kwon et al. ................. 438/671

FOREIGN PATENT DOCUMENTS
KR    1998021248 A  *  6/1998

OTHER PUBLICATIONS
Yao, "Dry Etching Trends in Flat Panel Display Processing," IEEE 1997 International Conference on Plasma Science, IEEE Conference Record—Abstracts, pp. 314-315 (May 19-22, 1997) (ISBN: 0-7803-3990-8).

* cited by examiner

*Primary Examiner*—Marcos D. Pizarro
*Assistant Examiner*—Raj Gupta
(74) *Attorney, Agent, or Firm*—Marshall, Gerstein & Borun LLP

(57) ABSTRACT

A method for forming a fine pattern of a semiconductor device includes forming a deposition film over a substrate having an underlying layer. The deposition film includes first, second, and third mask films. The method also includes forming a photoresist pattern over the third mask film, patterning the third mask film to form a deposition pattern, and forming an amorphous carbon pattern at sidewalls of the deposition pattern. The method further includes filling a spin-on-carbon layer over the deposition pattern and the amorphous carbon pattern, polishing the spin-on-carbon layer, the amorphous carbon pattern, and the photoresist pattern to expose the third mask pattern, and performing an etching process to expose the first mask film with the amorphous carbon pattern as an etching mask. The etching process removes the third mask pattern and the exposed second mask pattern. The method also includes removing the spin-on-carbon layer and the amorphous carbon pattern, and forming a first mask pattern with the second mask pattern as an etching mask.

14 Claims, 10 Drawing Sheets

FORMING FINE PATTERN OF SEMICONDUCTOR DEVICE USING THREE MASK LAYERS AND CMP OF SPIN-ON CARBON LAYER

CROSS-REFERENCE TO RELATED APPLICATION

The priority benefit of Korean patent application No. 10-2007-0042291 filed May 1, 2007, the entire disclosure of which is incorporated herein by reference, is claimed.

BACKGROUND OF THE INVENTION

1. Field of the Disclosure

The invention generally relates to a method for forming a fine pattern of a semiconductor device.

2. Brief Description of Related Technology

Due to the popularization of information media such as computers, semiconductor device technology has advanced rapidly. Semiconductor devices are required to operate at a high speed and to have a high storage capacity. Hence, it is desirable to manufacture high-capacity semiconductor memory devices with improved integration, reliability, and characteristics for accessing data.

To improve device integration, photolithography technology has developed to form fine patterns. The photolithography technology includes an exposure technology using chemically amplified Deep Ultra Violet (DUV) light sources such as ArF (193 nm) and VUV (157 nm), and a technology for developing photoresist materials suitable for the exposure light sources.

As semiconductor devices become smaller, it is important to control a critical dimension of a pattern line-width in the photolithography technology. Generally, the processing speed of semiconductor devices depends on the critical dimension of the pattern line-width. For example, as the line-width of the pattern is decreased, the processing speed is increased to improve device performance.

To improve resolution of photolithography technology and extend a process margin, a double patterning technology has been developed. The double patterning technology includes processes whereby a photoresist-coated wafer is respectively exposed by two masks, and then developed, thereby obtaining a complicated pattern, a dense pattern, or an isolated pattern.

Because the double patterning technology uses two masks for patterning, the manufacturing cost are greater than those of a single patterning technology using a single mask. And, since the technology requires much time to manufacture semiconductor device, the throughput is low. Moreover, it is difficult to control an overlay degree of patterns. As a result, when a pattern having a smaller pitch than a resolution limit of the exposer is formed in the cell region, illusory images overlap. Therefore, the double patterning technology does not obtain a desired pattern. In alignment, mis-alignment occurs by inaccuracy in overlay of patterns.

SUMMARY OF THE INVENTION

Various embodiments of the invention are directed at providing a method for forming a fine pattern of a semiconductor device, which pattern has a smaller pitch than a resolution limit of the exposer.

According to an embodiment of the invention, a method for forming a fine pattern of a semiconductor device includes forming a stack layer over a substrate having an underlying layer. The stack layer includes a first, a second, and a third mask films. The method includes forming a photoresist pattern on the third mask film, and etching the third mask film, with the photoresist pattern as an etching mask, to form a first stack pattern that includes the third mask pattern and the photoresist pattern. The method also includes forming an amorphous carbon pattern at the sidewall of the first stack pattern. The method further includes etching the second mask film, with the photoresist pattern and the amorphous carbon pattern as an etching mask, to form a second stack pattern compositing the amorphous carbon pattern, the first stack pattern and a second mask pattern. The method also includes forming a spin-on-carbon layer over the second stack pattern comprising the amorphous carbon pattern and the second mask pattern. The spin-on-carbon layer, the amorphous carbon pattern and the photoresist pattern is polished until the third mask pattern is exposed. The third mask pattern and the second mask pattern are etched to expose the first mask film with the amorphous carbon pattern as an etching mask. The spin-on-carbon layer and the amorphous carbon layer are removed. The first mask film is etched with the second mask pattern as an etching mask to form first mask pattern. The method further includes etching an underlying layer using the first mask pattern as an etching mask to form a underlying pattern.

The first mask film preferably is selected from the group consisting of an amorphous carbon layer, a silicon oxy-nitride film, a silicon nitride film, and combinations thereof. Each of the second and third mask films preferably is selected from the group consisting of a silicon oxy-nitride film, a silicon nitride film, a polysilicon film, a silicon oxide film, and combinations thereof. The photoresist pattern preferably has a ratio of line-width of the photoresist pattern to interval between patterns of 1:2 to 1:4, more preferably 1:3. The amorphous carbon pattern preferably is obtained by performing a chemical vapor deposition (CVD) process to deposit an amorphous carbon layer, and performing an etching process with an etching gas including $O_2$ and $N_2$. The amorphous carbon pattern preferably has a ratio of line-width of the pattern to interval between patterns of 1:1. The polishing process preferably is performed by an etch-back process or a Chemical Mechanical Polishing (CMP) process. The third-mask-pattern and second-mask-pattern-removing-step preferably are performed using a source gas including fluorocarbon gas. The fluoro-carbon gas is $CF_4$, $C_4F_6$, $CH_2F_2$, $CHF_3$ gas. The spin-on-carbon layer and the amorphous carbon layer preferably are removed by a strip process using oxygen plasma. The second mask pattern preferably has a ratio of line-width of the pattern to interval between patterns of 1:1.

The inventive method can include a photoresist etching barrier mask process step, which step is performed once to form the mask patterns, thereby obtaining the excellent overlay accuracy between photoresist patterns and simplifying the manufacturing cost and process steps to improve efficiency. In the method, after the amorphous carbon pattern is formed at a sidewall of the photoresist pattern, the amorphous carbon pattern is used as an etching mask. As a result, the method can avoid or minimize the mis-alignment that typically occurs in conventional processes, thereby obtaining a fine pattern pitch and critical dimension uniformity which cannot be obtained by lithography equipment.

Additional features of the invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings wherein.

Figure 1A:
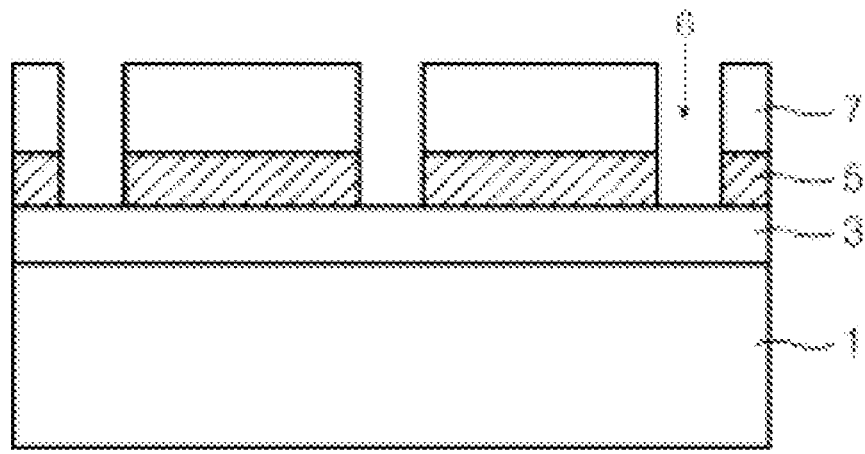
FIGS. 1a through 1d are cross-sectional diagrams illustrating a conventional method for forming a fine pattern of a semiconductor device.

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION OF THE SPECIFIC EMBODIMENT

The double patterning technology to form a fine pattern includes forming a trench to obtain a pattern, or forming a line to obtain a pattern.

FIGS. 1a through 1d are cross-sectional diagrams illustrating a conventional method of forming a fine pattern, which method includes forming a trench to obtain the fine pattern. FIGS. 2a through 2d are cross-sectional diagrams illustrating a conventional method of forming a fine pattern, which method includes forming a line to obtain the fine pattern.

Referring to FIG. 1a, an underlying layer 3, a mask film (not shown) and a first photoresist film (not shown) are deposited over a substrate 1. A first photolithography process is performed on the first photoresist film to form a first photoresist pattern 7. A first patterning process is performed on a mask film, with the first photoresist pattern 7 as an etching mask, to form a stack structure including a first mask pattern 5 and the first photoresist pattern 7 having a trench 6.

Figure 1B:
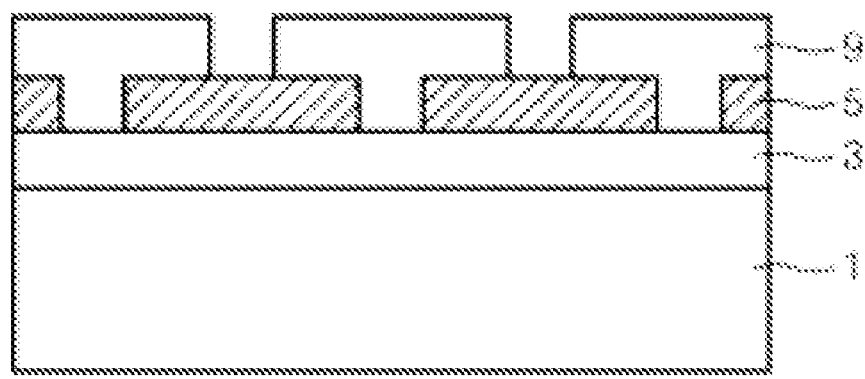

Referring to FIG. 1b, the first photoresist pattern 7 is removed, and a second photoresist film (not shown) is formed over the first mask pattern 5 and the substrate 1. A second photolithography process is performed on the second photoresist film to form a second photoresist pattern 9.

Figure 1C:
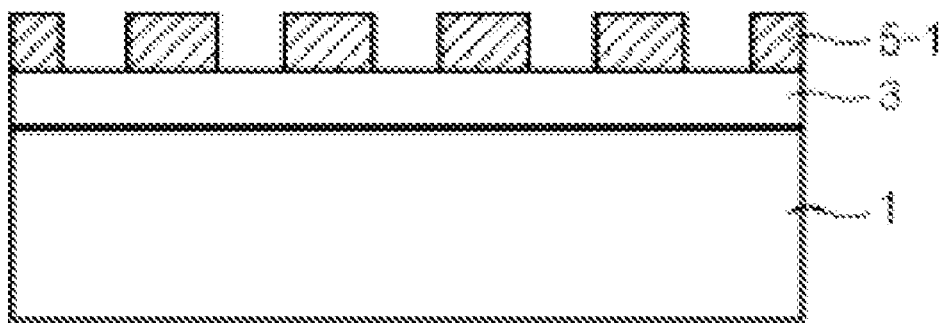

Referring to FIG. 1c, a second patterning process is performed on the first mask pattern 5, with the second photoresist pattern 9 as an etching mask. And then the second photoresist pattern 9 is removed. As a result, a second mask pattern 5-1 having a trench is formed.

Figure 1D:
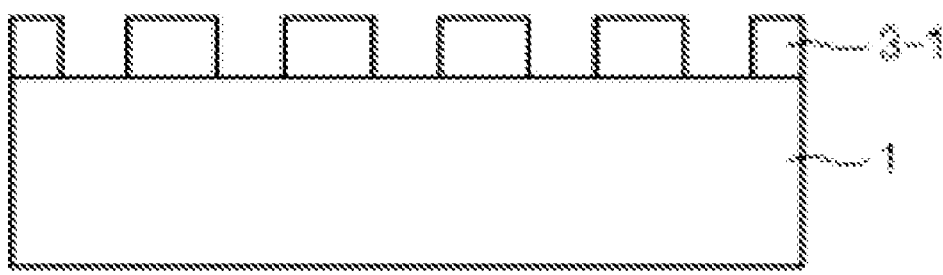

Referring to FIG. 1d, a patterning process is performed on the underlying layer 3, with the second mask pattern 5-1 as an etching mask, to obtain an underlying pattern 3-1. The second mask pattern 5-1 is removed by a dry or wet etching process.

As indicated above, FIGS. 2a through 2d are cross-sectional diagrams illustrating a conventional method of forming a fine pattern, which method includes forming a line to obtain the fine pattern.

Figure 2A:
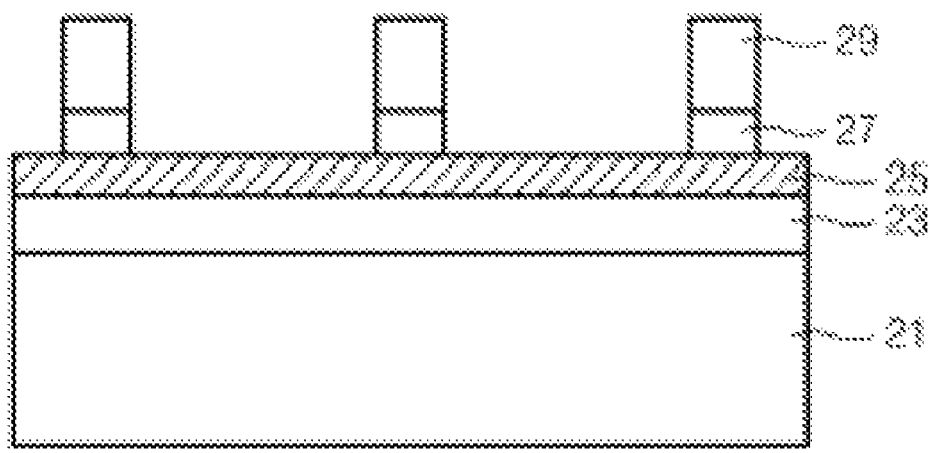
FIGS. 2a through 2d are cross-sectional diagrams illustrating a conventional method for forming a fine pattern of a semiconductor device.

Referring to FIG. 2a, an underlying layer 23, a first mask film 25, a second mask film (not shown) and a first photoresist film (not shown) are deposited over a substrate 21. A first photolithography process is performed on the first photoresist film to form a first photoresist pattern 29. A patterning process is performed on a second mask film, with the first photoresist pattern 29 as an etching mask, to form a stack structure including a second mask pattern 27 and the first photoresist pattern 29.

Figure 2B:
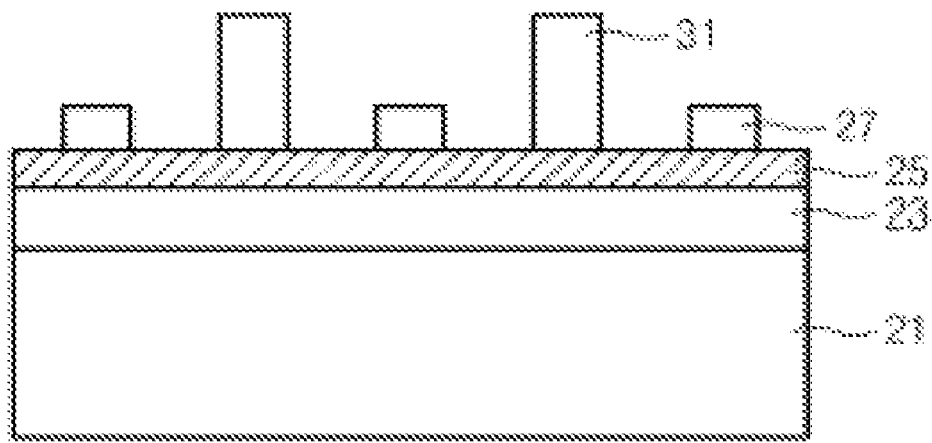

Referring to FIG. 2b, the first photoresist pattern 29 is removed, and a second photoresist film (not shown) is formed over the resulting structure. A second photolithography process is performed on the second photoresist film to form a second photoresist pattern 31 between the second mask patterns 27.

Figure 2C:
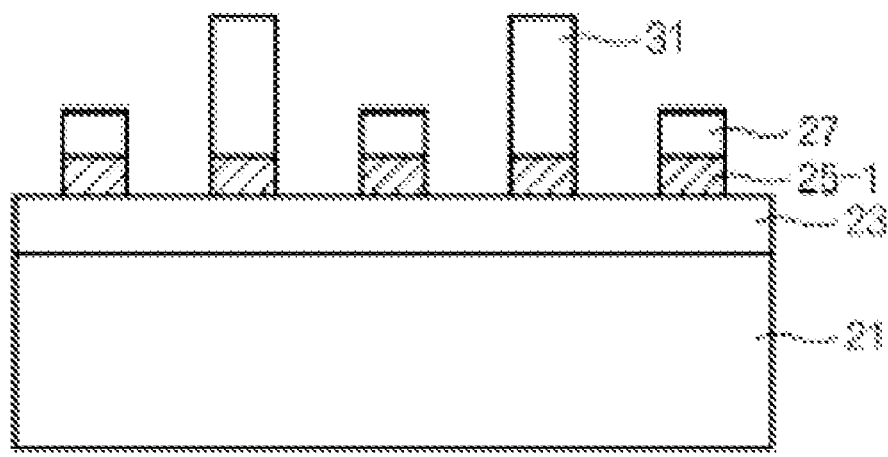

Referring to FIG. 2c, a patterning process is performed on the first mask film 25, with the second mask pattern 27 and the second photoresist pattern 31 together serving as an etching mask. As a result, two kinds of etching mask patterns are obtained. The two kinds of etching mask patterns include one structure including the first mask pattern 25-1 and the second photoresist pattern 31, and the other structure including the first mask pattern 25-1 and the second mask pattern 27.

Figure 2D:
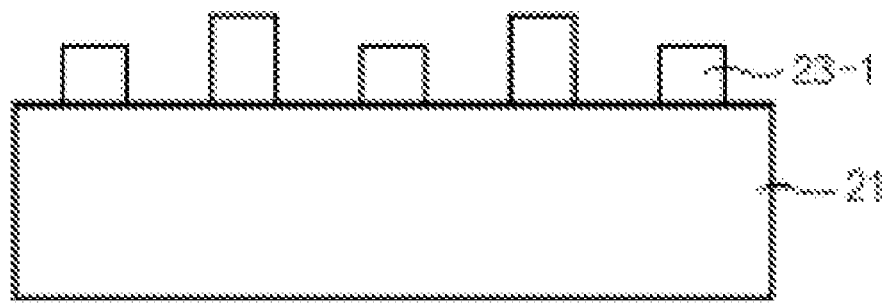

Referring to FIG. 2d, a patterning process is performed on the underlying layer 23 with two kinds of etching mask patterns to obtain an underlying pattern 23-1. However, as two kinds of the etching mask pattern including a different structure in patterning process are used, they do not have the same etching selectivity ratio. Therefore, it is difficult to obtain patterns having the same shape after patterning process.

Figure 3:
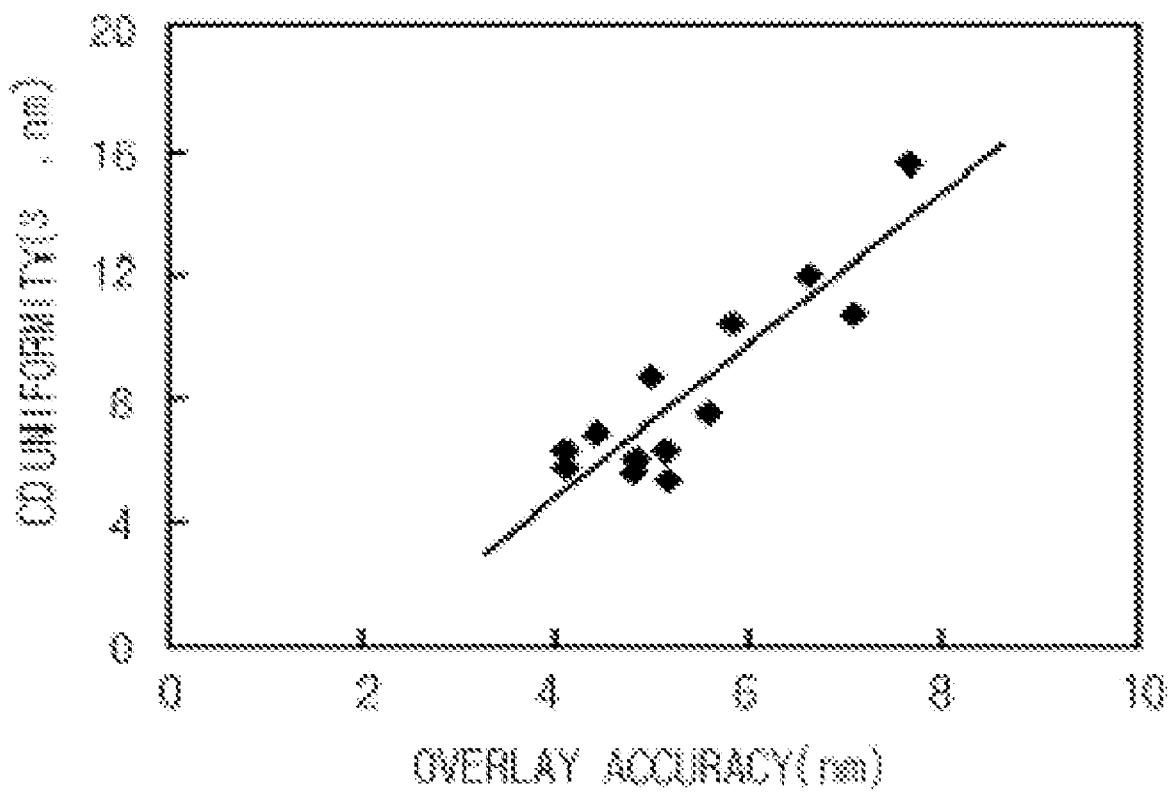
FIG. 3 is a graph illustrating overlapping uniformity between mask patterns obtained by a conventional method.

In order to form fine pattern having line-width uniformity of less than 40 nm, the overlay accuracy of the etching mask patterns should be regulated to be less than 3 nm. However, the overlay accuracy obtained by current process equipment is about 4 nm to about 7 nm (see FIG. 3). Because the etching mask patterns have low overlay accuracy, it is difficult to control a uniform critical dimension of the patterns.

FIGS. 4a through 4i are cross-sectional diagrams illustrating a method for forming a fine pattern of a semiconductor device according to the invention.

Figure 4A:
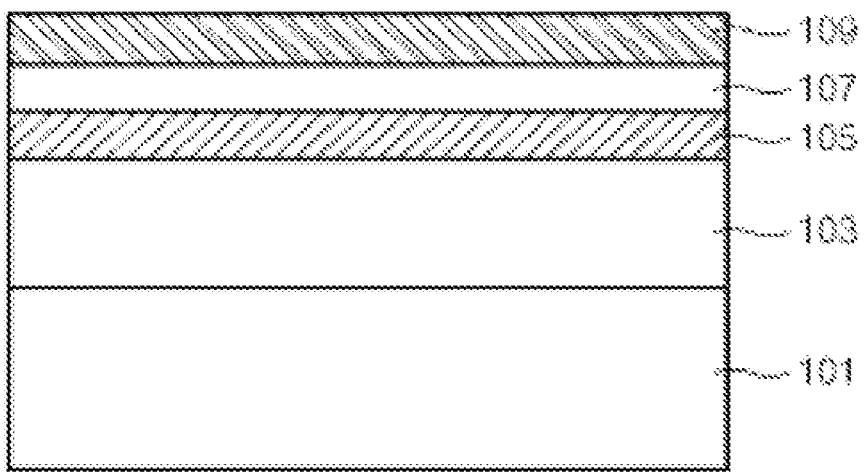
FIGS. 4a through 4i are cross-sectional diagrams illustrating a method for forming a fine pattern of a semiconductor device in accordance with the invention.

Referring to FIG. 4a, the first mask film 103 and 105, the second mask film 107 and the third mask film 109 are deposited over a substrate having an underlying layer 101. In this embodiment, the first mask film preferably is selected from group consisting of an amorphous carbon layer, a silicon oxy-nitride film, a silicon nitride film, and combinations thereof. Each of the second and third mask films preferably is selected from group consisting of a silicon oxy-nitride film, a silicon nitride film, a polysilicon film, a silicon oxide film, and combinations thereof. Preferably, the first mask film is formed of a stack film including a first amorphous carbon layer 103 and a silicon nitride film 105, which is a buffer film. The second mask film 107 preferably is formed of a polysilicon film. The third mask film 109 preferably is formed of a silicon oxide film or a silicon nitride film.

Figure 4B:
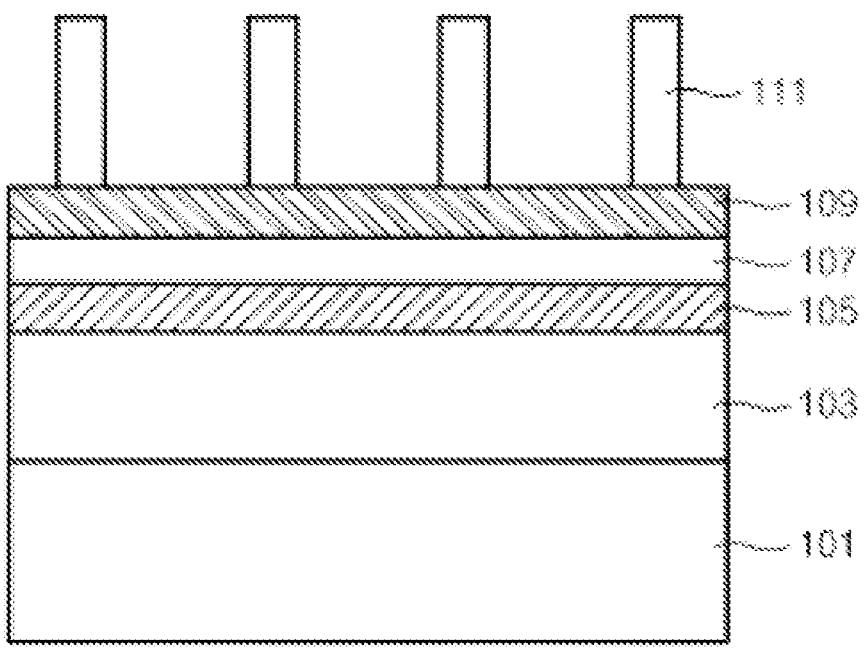

Referring to FIG. 4b, a photoresist pattern 111 is formed over the third mask film 109 preferably by a photolithography process. In this embodiment, the ratio of line-width of the photoresist pattern and interval between patterns can be adjusted depending on an etching bias. The interval between patterns preferably is three times larger than a half pitch obtained by the lithography equipment. The photoresist pattern preferably has a ratio of line-width of the photoresist pattern to interval between patterns of 1:2 to 1:4, preferably 1:3.

Figure 4C:
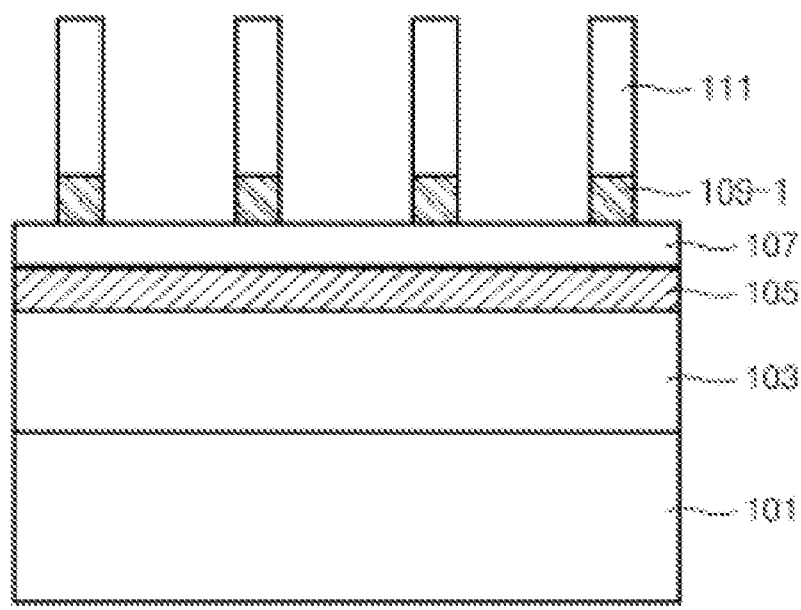

Referring to FIG. 4c, the third mask film 109 is patterned, with the photoresist pattern 111 as an etching mask, until the second mask film 107 is exposed, thereby obtaining a first stack pattern including a third mask pattern 109-1 and the photoresist pattern 111.

Figure 4D:
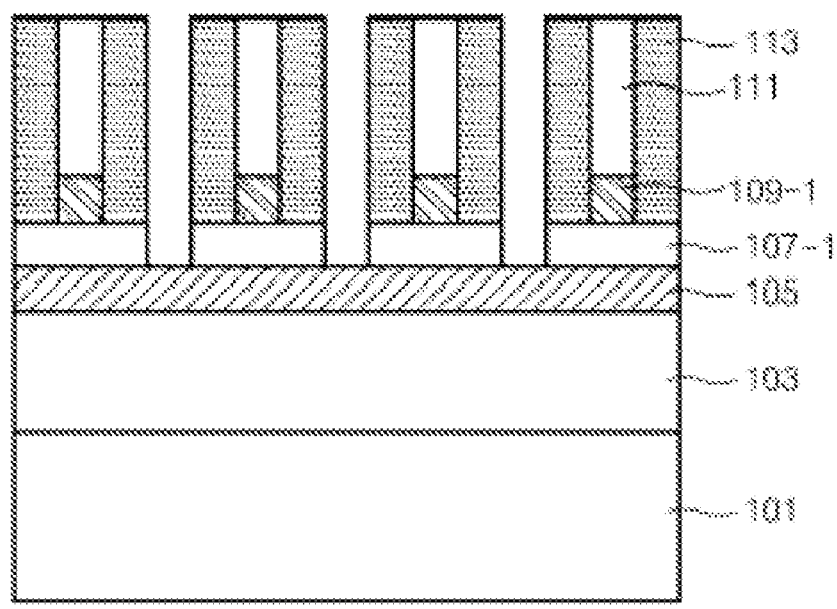

Referring to FIG. 4d, a second amorphous carbon layer (not shown) is formed over the first stack pattern and the exposed second mask film 107. And the second amorphous carbon layer and the exposed second mask film 107 are etched until the silicon nitride film 105 is exposed, thereby forming a second stack pattern comprising the second amorphous carbon pattern 113 formed at a sidewall of the first stack pattern and the second mask pattern 107-1.

The second amorphous carbon layer preferably is deposited at less than 100° C. by a chemical vapor deposition (CVD) method. The etching process preferably is performed on the second amorphous carbon layer using a source gas including $O_2$ and $N_2$ as an etching gas.

Preferably, the second amorphous carbon pattern 113 has a ratio of line-width of the pattern to interval between patterns of 1:1, to have a smaller pitch than a space between the stack patterns.

The method for forming the amorphous carbon pattern, or a next generation (NG) process performed with equipment produced by LAM Co., is already well known to a person having ordinary skill in the art (Plasma Science, 1997. IEEE conference Record-Abstract., 1997 IEEE international Conference on Volume, Issue, 19-22 May 1997 page(s) 314-315). The method includes depositing an amorphous carbon layer over the resulting structure, including the photoresist pattern, in a chamber, and etching the amorphous carbon layer to form the amorphous carbon pattern having a smaller interval than that between photoresist patterns obtained in the previous step at the sidewall of the photoresist patterns.

Figure 4E:
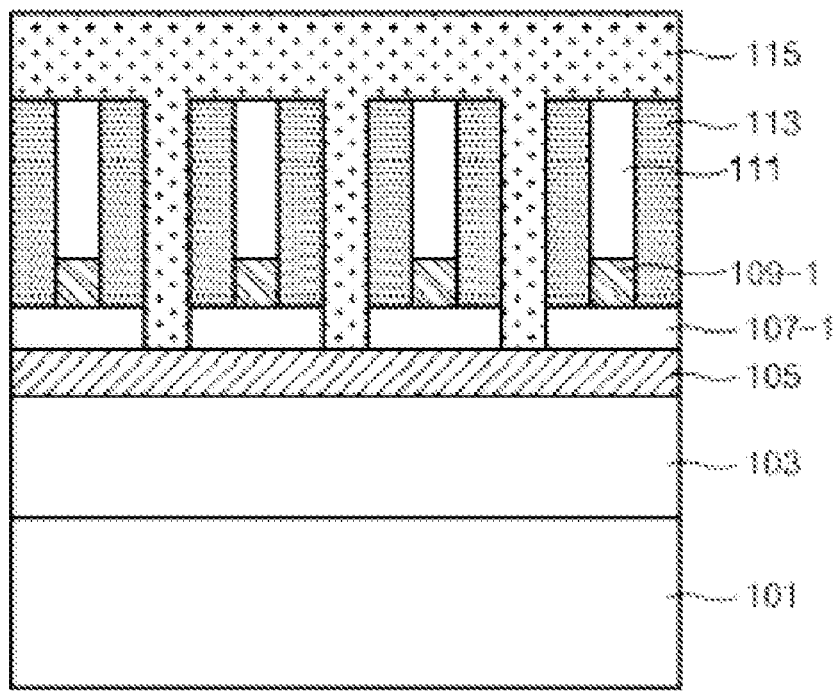

Referring to FIG. 4e, a spin-on-carbon layer 115 is formed over the exposed silicon nitride film 105 and the second stack pattern comprising the second amorphous carbon pattern 113 formed at a sidewall of the first stack pattern and the second mask pattern 107-1. The spin-on-carbon layer 115 preferably is gap-filled in an interval between the second amorphous carbon patterns.

Figure 4F:
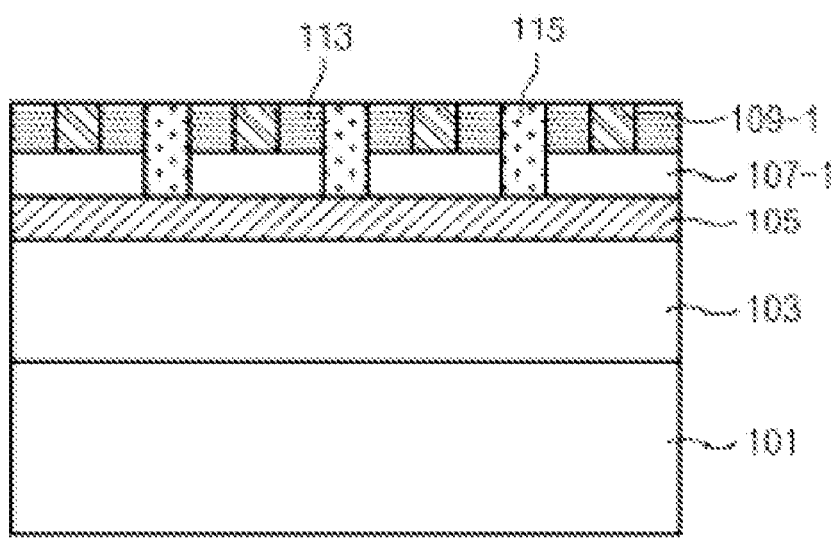

Referring to FIG. 4f, a polishing process is performed on the photoresist pattern 111, the second amorphous carbon pattern 113, and the spin-on-carbon layer 115 until the third mask pattern 109-1 is exposed.

The polishing process preferably is performed by CMP process or an etch-back process using an $O_2$ etching gas. When the polishing process is performed by etch-back process, the etching selectivity of the spin-on-carbon layer, the photoresist pattern, and the second amorphous carbon pattern to the $O_2$ etching gas is higher than those of the silicon oxide film or the silicon nitride film. Therefore, the third mask pattern 109-1 is used as an etching barrier film during the polishing process.

Figure 4G:
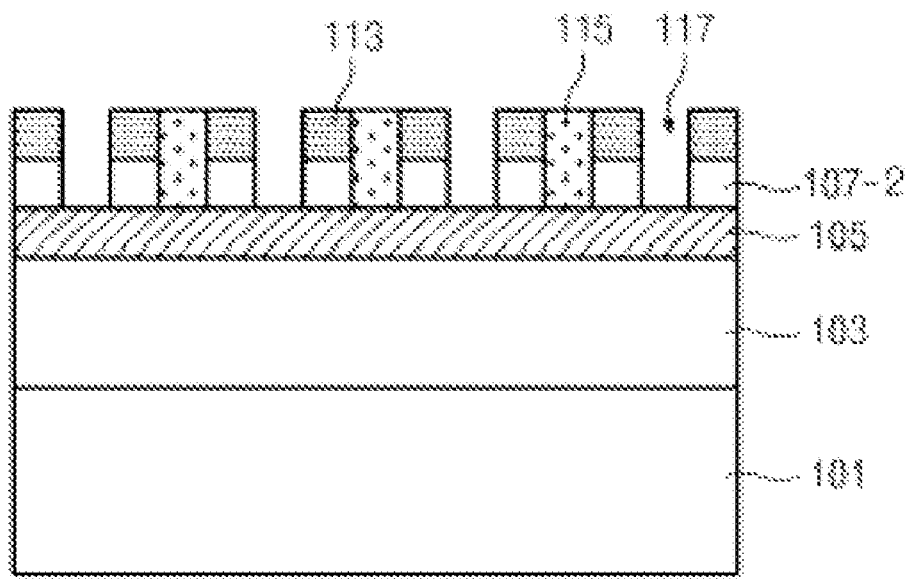

Referring to FIG. 4g, the third mask pattern 109-1 is etched, with the second amorphous carbon pattern 113 as an etching mask, and the exposed second mask pattern 107-1 is etched until the silicon nitride film 105 is exposed, thereby forming the second mask pattern 107-2 and a contact hole 117.

The etching process preferably is performed using a source gas including fluoro carbon gas. The fluoro carbon gas is $CF_4$, $C_4F_6$, $CH_2F_2$, $CHF_3$ gas. Because the etching selectivity of the silicon nitride film, silicon oxide film, and the polysilicon layer to the fluoro carbon gas is larger than that of the second amorphous carbon pattern 113, the second amorphous carbon pattern 113 is used as an etching mask during the etching process so that the third mask pattern 109-1 and the exposed polysilicon layer pattern 107-1 are etched. Moreover, because the second amorphous carbon layer is used as an etching mask, the second mask pattern 107-1 disposed under the second amorphous carbon pattern 113 remains after etching process. As a result, the second amorphous carbon layer 113 is formed over the second mask pattern 107-2, and the spin-on-carbon layer 115 is filled between the second mask patterns 107-2.

Figure 4H:
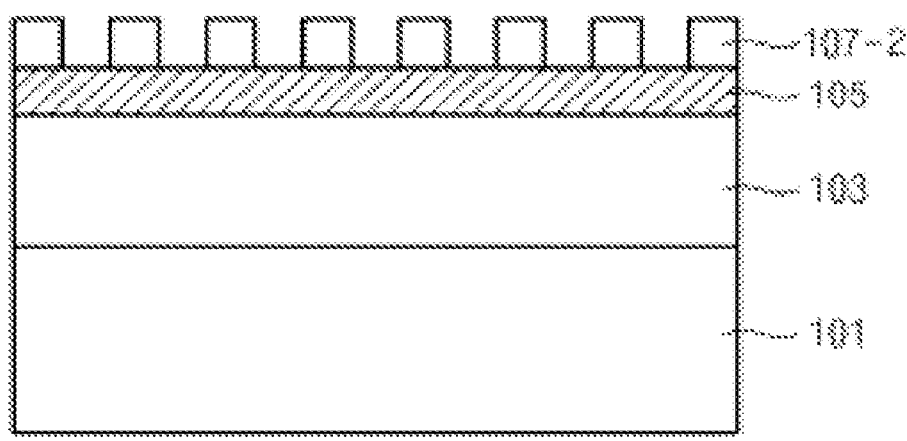

Referring to FIG. 4h, a strip process preferably is performed using $O_2$ plasma on the resulting structure to remove the spin-on-carbon layer 115 and the second amorphous carbon pattern 113. As a result, the second mask pattern 107-2 remains. The second mask pattern 107-2 preferably has a ratio of line-width of the pattern to interval between patterns of 1:1, like the second amorphous carbon pattern 113. The silicon nitride film 105, a buffer film, prevents damage of the first amorphous carbon layer 103 during etching process using the source gas including fluoro carbon gas. The fluoro carbon gas is $CF_4$, $C_4F_6$, $CH_2F_2$, $CHF_3$ gas.

Figure 4I:
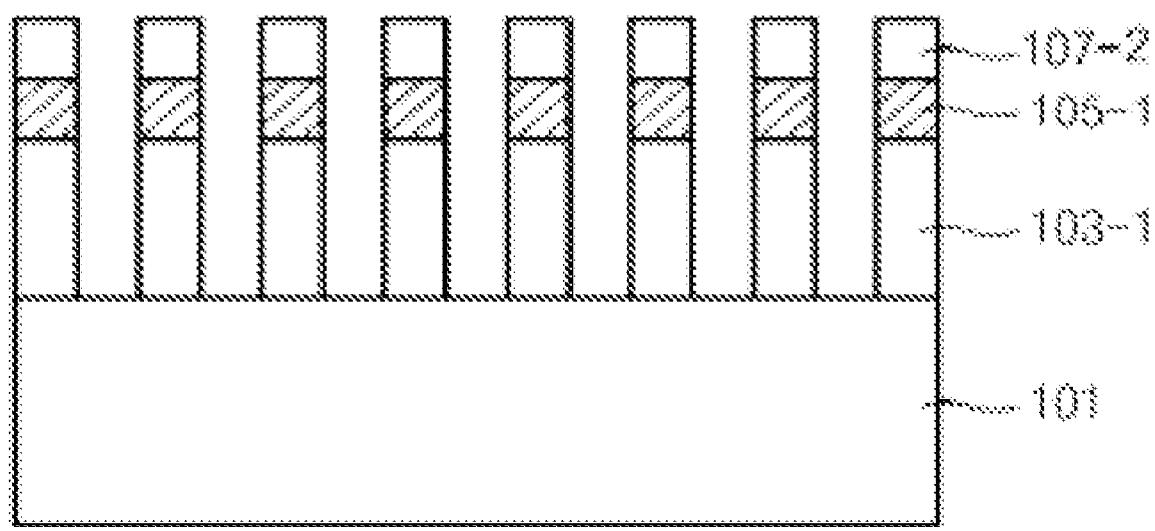

Referring to FIG. 4i, an etching process is performed on the silicon nitride film 105 and the first amorphous carbon layer 103, with the second mask pattern 107-2 as an etching mask, to form a stack pattern, including a first amorphous carbon pattern 103-1, a silicon nitride pattern 105-1, and a second mask pattern 107-2. The underlying layer 101 is etched with the stack pattern as an etching mask, thereby obtaining a fine underlying layer pattern (not shown) having a ratio of line-width of the pattern: an interval between patterns of 1:1.

As described above, according to an embodiment of the present invention, the inventive method includes forming an amorphous carbon pattern at both sidewalls of a photoresist pattern used as a conventional etching mask, patterning a mask film using the photoresist pattern and the amorphous carbon pattern to obtain a mask pattern, and etching an underlying layer with the mask pattern as an etching mask, thereby simplifying process steps and obtaining a fine pattern regardless of the overlap accuracy of an exposer.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications will be obvious to a person of ordinary skill in the art in view of the present disclosure, and are intended to fall within the scope of the appended claims.

What is claimed is:

1. A method for forming a fine pattern of a semiconductor device, the method comprising:

forming a stack layer over a substrate having an underlying layer, the stack layer comprising a first, a second, and a third mask films;

forming a photoresist pattern over the third mask film;

patterning the third mask film, using the photoresist pattern as an etching mask, to form a first stack pattern comprising a third mask pattern and the photoresist pattern;

forming an amorphous carbon layer over the resultant including the first stack pattern;

selectively patterning the amorphous carbon layer to form an amorphous carbon pattern formed at sidewalls of the first stack pattern;

patterning the second mask film using the amorphous carbon pattern and the photoresist pattern as an etching mask to form a second mask pattern, whereby forming a second stack pattern comprising the amorphous carbon pattern, the first stack pattern and the second mask pattern;

forming a spin-on-carbon layer over the second stack pattern;

polishing the spin-on-carbon layer to expose the third mask pattern;

performing an etching process using the amorphous carbon pattern and the spin-on carbon layer as an etching mask to expose the first mask film, whereby removing the third mask pattern and the exposed second mask pattern;

removing the spin-on-carbon layer and the amorphous carbon pattern; and selectively etching the first mask film using the second mask pattern as an etching mask to form a first mask pattern.

2. The method according to claim 1, further comprising etching the underlying layer using the first mask pattern as an etching mask to form a underlying layer pattern.

3. The method according to claim 1, wherein the first mask film is selected from the group consisting of an amorphous carbon layer, a silicon oxy-nitride film, a silicon nitride film, and combinations thereof.

4. The method according to claim 1, wherein each of the second and third mask films is selected from the group consisting of a silicon oxy-nitride film, a silicon nitride film, a polysilicon film, a silicon oxide film, and combinations thereof.

5. The method according to claim 1, wherein the amorphous carbon layer is formed by performing a chemical vapor deposition process.

6. The method according to claim 1, wherein the amorphous carbon pattern is formed by an etching process using an etching gas comprising $O_2$ and $N_2$.

7. The method according to claim 1, wherein the amorphous carbon pattern has a ratio of line-width of the pattern to interval between patterns of 1:1.

8. The method according to claim 1, wherein the spin-on-carbon layer and the amorphous carbon layer are removed by a strip process using oxygen plasma, respectively.

9. The method according to claim 1, wherein the second mask pattern has a ratio of line-width of the pattern to interval between patterns of 1:1.

10. The method according to claim 1, wherein a ratio of line-width of the photoresist pattern to interval between photoresist patterns is 1:2 to 1:4.

11. The method according to claim 10, wherein the ratio is 1:3.

12. The method according to claim 1, wherein the polishing process is performed by an etch-back process or a chemical mechanical polishing process.

13. The method according to claim 12, wherein the etch-back process is performed using a source gas including fluoro carbon gas.

14. A semiconductor device comprising a fine pattern formed by the method of claim 1.

* * * * *